United States Patent
Li et al.

(10) Patent No.: US 11,839,067 B2
(45) Date of Patent: Dec. 5, 2023

(54) RACK DEVICE AND POWER MODULE THEREOF

(71) Applicant: DELTA ELECTRONICS, INC., Taoyuan (TW)

(72) Inventors: Sheng-Hua Li, Taoyuan (TW); Wen-Lung Huang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 150 days.

(21) Appl. No.: 17/521,413

(22) Filed: Nov. 8, 2021

(65) Prior Publication Data

US 2022/0369522 A1 Nov. 17, 2022

(30) Foreign Application Priority Data

May 14, 2021 (CN) .......................... 202121036222.0

(51) Int. Cl.
*H05K 7/14* (2006.01)
*H05K 7/20* (2006.01)

(52) U.S. Cl.
CPC ....... *H05K 7/20909* (2013.01); *H05K 7/1492* (2013.01)

(58) Field of Classification Search
CPC ............. H05K 7/20909; H05K 7/1492; H05K 7/20918; H01F 27/2876
See application file for complete search history.

(56) References Cited

U.S. PATENT DOCUMENTS

| 10,763,026 | B2* | 9/2020 | Fujita | H01F 27/2823 |
| 11,195,648 | B2* | 12/2021 | Fukuchi | H01L 23/427 |
| 2002/0075120 | A1* | 6/2002 | Yeh | H01F 27/2804 |
| | | | | 336/223 |

* cited by examiner

*Primary Examiner* — Anthony Q Edwards
*Assistant Examiner* — Hung Q Dang
(74) *Attorney, Agent, or Firm* — Chun-Ming Shih; HDLS IPR SERVICES

(57) ABSTRACT

A rack device having a cabinet and power modules stacked in the cabinet is provided. The power module has a frame, an insulative plate, an insulative cover and transformers. The insulative plate is arranged in the frame. The insulative cover is arranged in the frame and disposed spacedly from and parallel with the insulative plate. Each transformer arranged in the frame has a high-voltage set and a low-voltage set electrically connected with each other. The low-voltage sets are arranged on one surface of the insulative plate and do not protrude from the frame, and the high-voltage sets are arranged on another surface of the insulative plate and between the insulative plate and the insulative cover. The frame of each power module is connected with the frame of adjacent power module, and the frame of at least one of the power modules is connected to the cabinet.

20 Claims, 5 Drawing Sheets

RACK DEVICE AND POWER MODULE THEREOF

BACKGROUND OF THE DISCLOSURE

Technical Field

This disclosure is directed to a power module and in particular to a power module with open architecture.

Description of Related Art

A related cabinet has a plurality of slots for plugging power module(s), a number of the power module(s) is defined corresponding to a load requirement of the equipment in the cabinet. Each power module generally has a casing, and a high-voltage coil and a low-voltage coil are accommodated in the casing for voltage transformation. However, generally, multiple power modules are required, the respective casing has redundant space, and the redundant space collectively occupies huge space in the cabinet. Furthermore, the unused slots also cause redundant space.

In view of the above drawbacks, the inventor proposes this disclosure based on his expert knowledge and elaborate researches in order to solve the problems of related art.

SUMMARY OF THE DISCLOSURE

This disclosure is directed to a rack device and a power module with open architecture.

In some embodiments, a power module having a frame, an insulative plate, an insulative cover and a plurality of transformer is provided. The insulative plate is arranged in the frame. The insulative cover is arranged in the frame and disposed spacedly from and parallel with the insulative plate. The transformers are arranged in the frame, and each of the transformers has a high-voltage set and a low-voltage set electrically connected with the high-voltage set. The low-voltage sets are arranged on one surface of the insulative plate and do not protrude from the frame, the high-voltage sets are arranged on another surface of the insulative plate, and the high-voltage sets are arranged between the insulative plate and the insulative cover.

According to the power module of this disclosure, a fan is respectively arranged in the frame corresponding to each transformer. Each fan is disposed on an edge of the corresponding insulative plate and crosses the two surfaces of the insulative plate. The respective fan is electrically connected to the respective corresponding transformer.

According to the power module of this disclosure, the insulative cover is arranged on a side of the frame.

According to the power module of this disclosure, the high-voltage sets are fixed on the insulative plate and clamped between the insulative plate and the insulative cover.

According to the power module of this disclosure, each of the high-voltage sets has a housing and a plurality of high-voltage components accommodated in the housing. The housing is provided with an air inlet and an air outlet, and a heat dissipation flow channel is defined between the air inlet and air outlet. An elastic supporter is arranged in the housing, and the elastic supporter passes through the housing to abut against the insulative cover.

According to the power module of this disclosure, the frame is provided with a plurality of fastening holes penetrating the frame.

A rack device having a cabinet and a plurality of aforementioned power modules is provided. The power modules are stacked in the cabinet, the frame of each power module is connected with the frame of another adjacent power module, and the frame of at least one of the power modules is connected to the cabinet.

Accordingly, the power modules according to the disclosure may be arranged and stacked arbitrarily and assembled by screwing via the frame, and the corresponding slots do not need to be additionally arranged in the cabinet. Furthermore, the plurality of transformers is disposed in the same frame to reduce the occupancies of casings. Therefore, the power module may be more compact and manufacturing cost may be reduced. Moreover, efficiency of heat dissipation of the respective transformer may be increased in the open type frame.

BRIEF DESCRIPTION OF THE DRAWINGS

The features of the disclosure believed to be novel are set forth with particularity in the appended claims. The disclosure itself, however, may be best understood by reference to the following detailed description of the disclosure, which describes a number of exemplary embodiments of the disclosure, taken in conjunction with the accompanying drawings, in which:

DETAILED DESCRIPTION OF THE EMBODIMENTS

Figure 1:
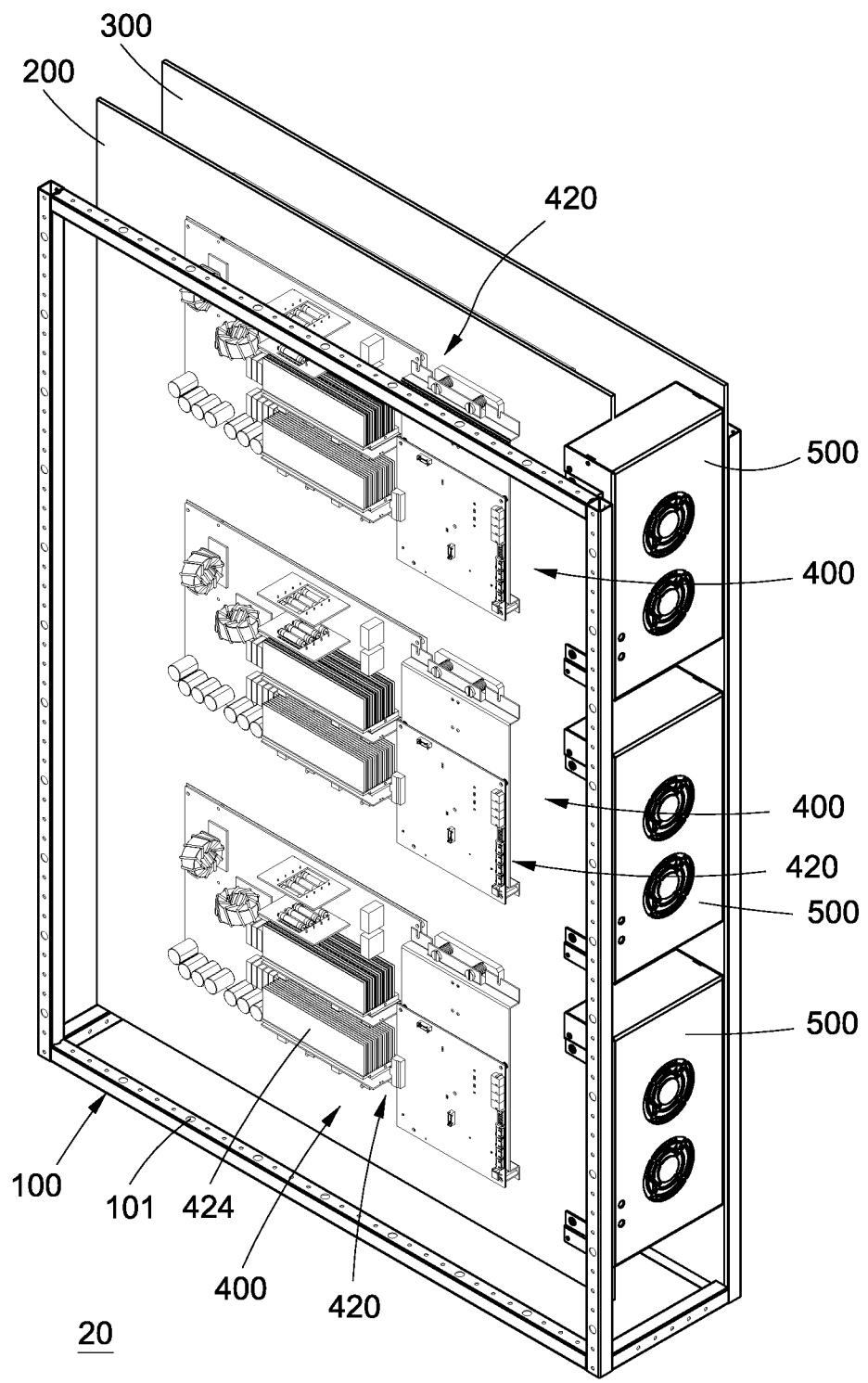
FIGS. 1 and 2 are perspective views showing a power module according to the first embodiment of this disclosure.
Figure 2:
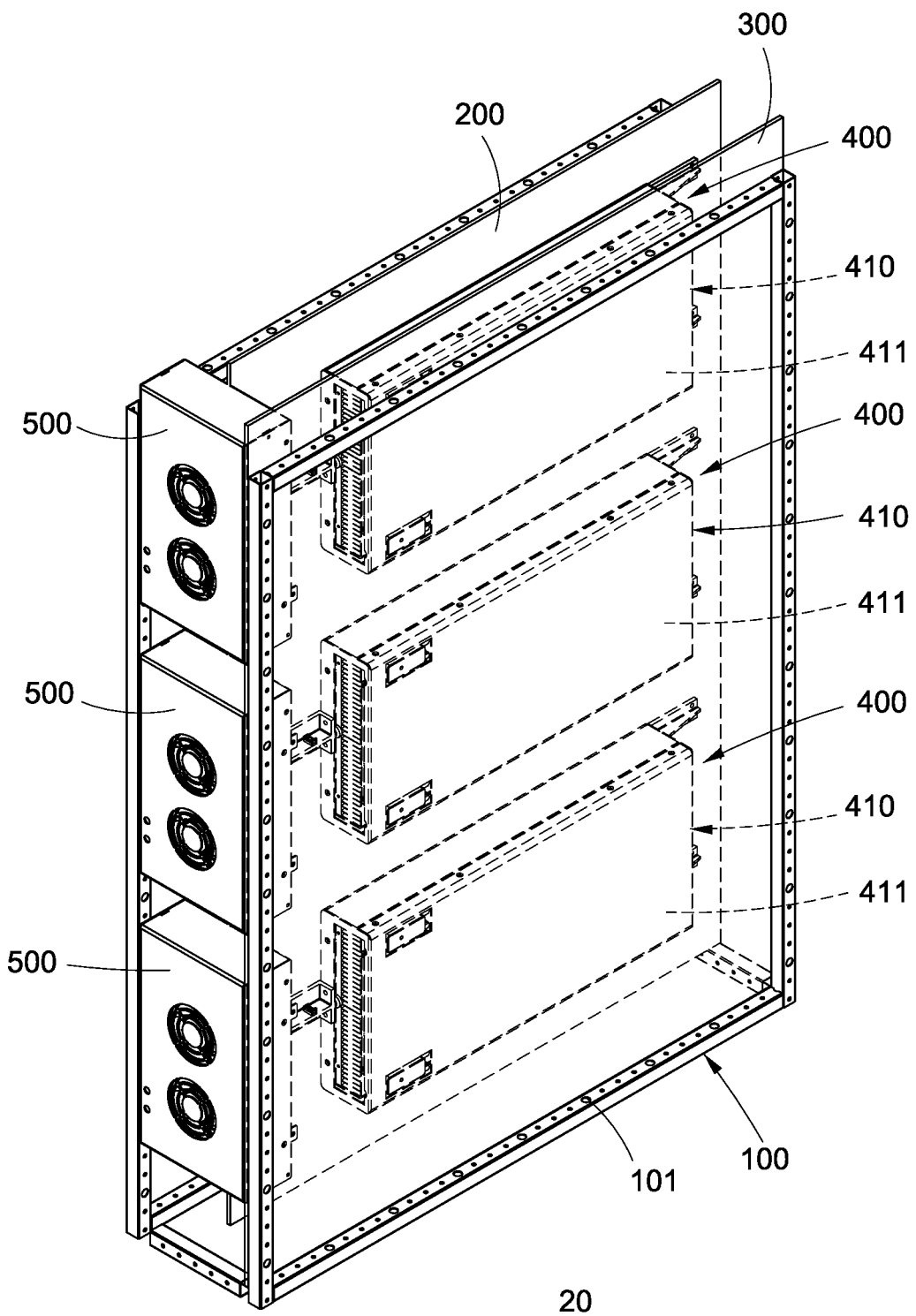
Figure 3:
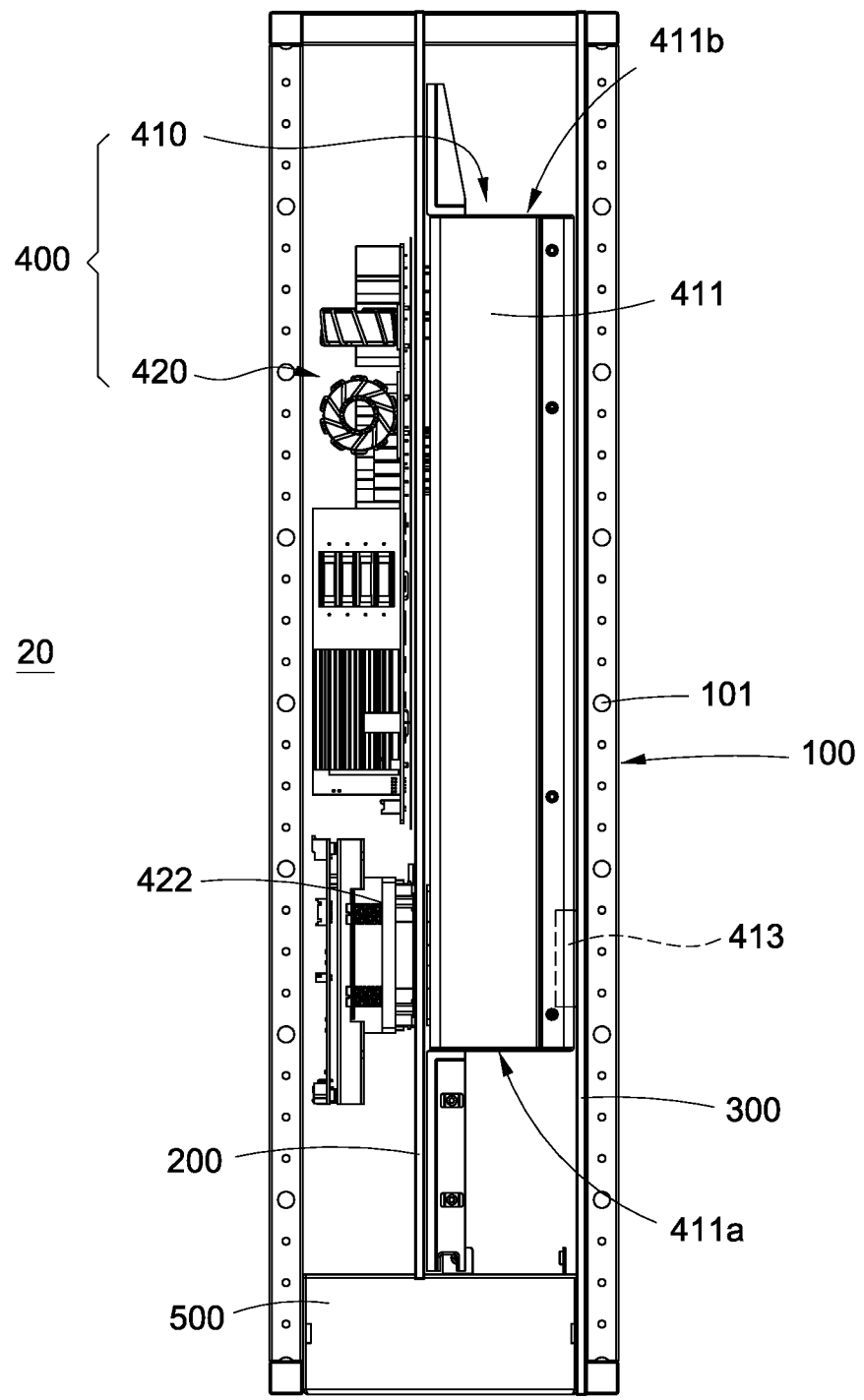
FIG. 3 is a side view showing the power module according to the first embodiment of this disclosure.
Figure 4:
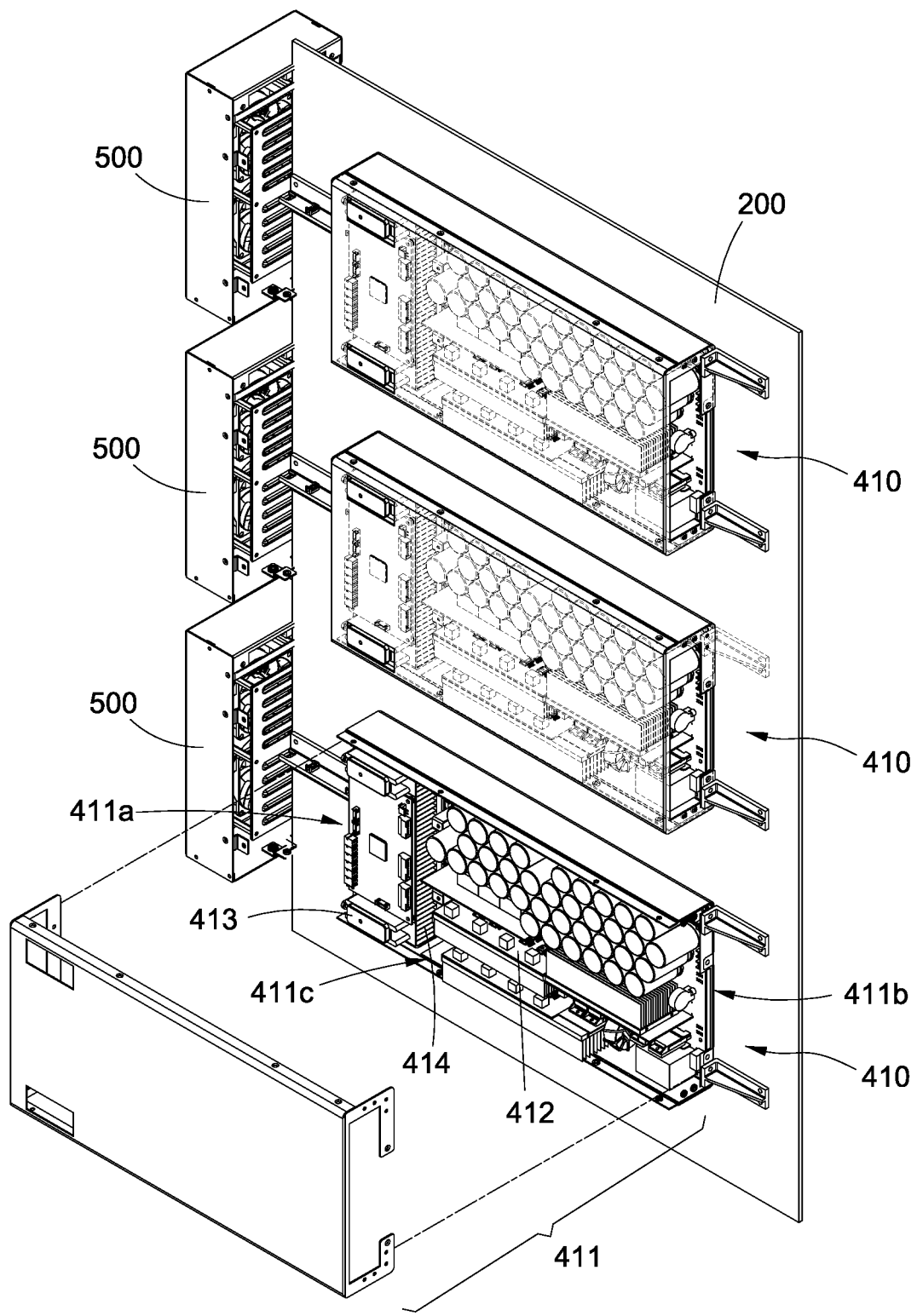
FIG. 4 is a perspective view showing a high-voltage set of the power module according to the first embodiment of this disclosure.

The technical contents of this disclosure will become apparent with the detailed description of embodiments accompanied with the illustration of related drawings as follows. It is intended that the embodiments and drawings disclosed herein are to be considered illustrative rather than restrictive.

According to the first embodiment of this disclosure shown in FIGS. 1 to 4, a power module 20 having a frame 100, an insulative plate 200, an insulative cover 300, a plurality of transformers 400 and a plurality of fans 500 corresponding to the transformers 400 is provided.

According to this embodiment, the frame 100 is a rectangular frame having a plurality of linkages (or rods), and each linkage of the frame 100 is provided with a plurality of fastening holes 101 penetrating the frame 100.

The insulative plate 200 is arranged in the frame 100, the insulative cover 300 is arranged in the frame 100 and disposed spacedly from and parallel with the insulative plate 200. According to this embodiment, the insulative cover 300 is disposed at a side of the frame 100.

The transformer 400 is arranged in the frame 100 and a number of the transformer 400 may be selected according to various requirements. Each transformer 400 has a high-voltage set 410 and a low-voltage set 420 electrically connected with the high-voltage set 410, and the high-voltage set 410 and the low-voltage set 420 of each transformer 400 are respectively disposed on two surfaces of the insulative plate 200 and separated from each other by the insulative plate 200. Moreover, the high-voltage sets 410 are further covered by the insulative cover 300 to be electromagnetically isolated from environment. Specifically, the low-voltage sets 420 are arranged on one surface of the insulative plate 200 and do not protrude from the frame 100 so as to be enclosed by the frame 100 to prevent collision. The high-voltage sets 410 are disposed on another surface of the insulative plate 200, and the high-voltage sets 410 are arranged between the insulative plate 200 and the insulative cover 300. The high-voltage sets 410 are fixed on the insulative plate 200 and clamped between the insulative plate 200 and the insulative cover 300.

Each high-voltage set 410 has a housing 411 and a plurality of high-voltage components 412, and may further have at least one heat dissipation fin set 414. The high-voltage components 412 have at least one high-voltage coil and may have another electronic component (for example, capacitor, etc.) according to design requirement. The high-voltage components 412 are accommodated in the housing 411, the housing 411 is made of metal, and the sharp corners of the high-voltage components 412 may easily form high-voltage electric field. The housing 411 may cover the high-voltage electric field to prevent the high-voltage electric field from interfering with another adjacent electronic component. The housing 411 is provided with an air inlet 411a and an air outlet 411b, a heat dissipation flow channel 411c is defined between the air inlet 411a and the air outlet 411b, and the heat dissipation fin set 414 is disposed in the heat dissipation flow channel 411c. An elastic supporter 413 is arranged in the housing 411, and the elastic supporter 413 penetrates the housing 411 to abut against the insulative cover 300 so as to position the high-voltage set 410.

Each low-voltage set 420 has a plurality of low-voltage components 422 and may further has at least one heat dissipation fin set 424. The low-voltage components 422 have at least one low-voltage coil and may have another electronic component (for example, capacitor, etc.) according to design requirement. The number of turns of the low-voltage coil is different from that of the high-voltage coil, and the current may flow through the high-voltage component 412 and the low-voltage component 422 to transform the voltage.

Each fan 500 is disposed on an edge of the insulative plate 200 and crosses the two surfaces of the insulative plate 200. Two sides of each fan 500 divided by the insulative plate 200 respectively face the high-voltage set 410 and the low-voltage set 420 of the corresponding transformer 400. Accordingly, the fan 500 may drive air to respectively flow to the high-voltage set 410 and the low-voltage set 420 correspondingly. Each fan 500 is electrically connected to each transformer 400 correspondingly. Moreover, at least a portion of each fan 500 is aligned toward the air inlet 411a of the corresponding high-voltage set 410. Therefore, the fan 500 may drive air to flow through the corresponding housing 411 so as to dissipate heat from the high-voltage component 412 in the housing 411. The high-voltage set 410 has a higher heat generation rate during operation, and the heat-exchange efficiency between air flow and the high-voltage component 412 may be increased via the arrangement of heat dissipation flow channel 411c. The low-voltage set 420 has a heat generation rate lower than the high-voltage set 410 during operation and may be arranged in an open structure so as to be cooled by a dispersed air flow.

Figure 5:
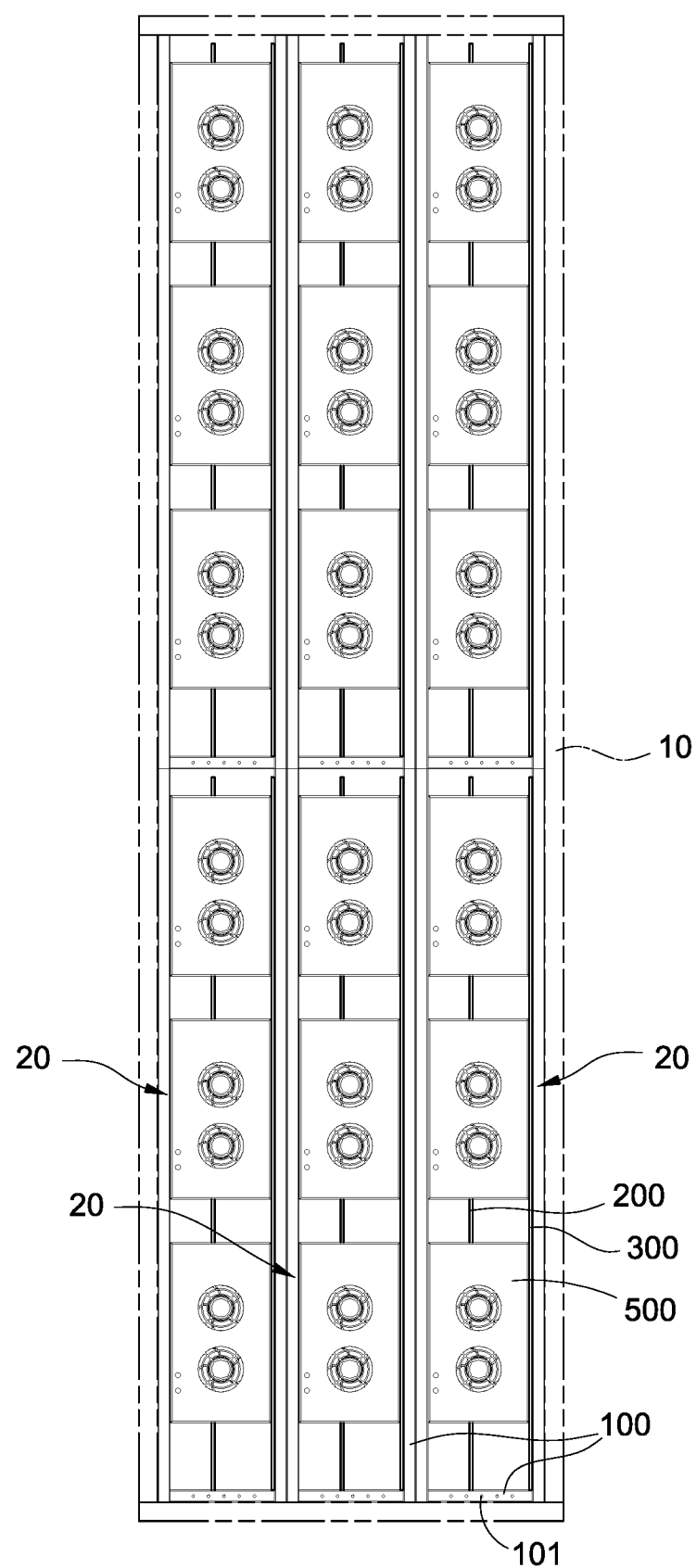
FIG. 5 is a perspective view showing a rack device according to the second embodiment of this disclosure.

According to the second embodiment of this disclosure shown in FIG. 5, a rack device is provided. The rack device according to this embodiment may be a server or an industrial computer which has a cabinet 10 and a plurality of aforementioned power modules 20. According to this embodiment, the power modules 20 are stacked in the cabinet 10, the frame 100 of each power module 20 is connected with the frame 100 of another adjacent power module 20, and a bolt may be inserted through the fastening hole 101 on the frame 100 so as to screw and fix the frames 100 connected with each other. Therefore, the stacked power modules 20 may be connected and fixed with each other.

Furthermore, some of the power modules 20 are connected to the cabinet 10 via the frame 100 thereof, a bolt may be inserted through the fastening hole 101 on the frame 100 so as to screw the frames 100 to the cabinet 10. Therefore, the power modules 20 may be fixed in the cabinet 10.

Accordingly, the power modules 20 according to the disclosure may be arranged and stacked arbitrarily and assembled by screwing via the frame 100, and the corresponding slots do not need to be additionally arranged in the cabinet 10. Furthermore, the plurality of transformers 400 are disposed in the same frame 100 to reduce the occupancies of casings. Therefore, the power module 20 may be more compact and manufacturing cost may be reduced. Moreover, efficiency of heat dissipation of the respective transformers 400 may be increased in the open type frame 100.

While this disclosure has been described by means of specific embodiments, numerous modifications and variations could be made thereto by those skilled in the art without departing from the scope and spirit of this disclosure set forth in the claims.

What is claimed is:

1. A power module, comprising:
   a frame for fastening;
   an insulative plate, arranged in the frame;
   an insulative cover, arranged in the frame, and disposed spacedly from and parallel with the insulative plate; and
   a plurality of transformers, arranged together on the insulative plate and accommodated in the frame, and each transformer comprising a high-voltage set and a low-voltage set electrically connected with each other,
   wherein the low-voltage sets are arranged together on one surface of the insulative plate and free of protruding from the frame, the high-voltage sets are arranged together on another surface of the insulative plate, and the high-voltage sets are arranged between the insulative plate and the insulative cover.

2. The power module according to claim 1, wherein a fan is respectively arranged in the frame corresponding to each transformer.

3. The power module according to claim 2, wherein each fan is disposed on an edge of the insulative plate and crosses two surfaces of the insulative plate.

4. The power module according to claim 2, wherein each fan is electrically connected to each transformer correspondingly.

5. The power module according to claim 1, wherein the insulative cover is arranged on a side of the frame.

6. The power module according to claim 1, wherein the high-voltage sets are fixed on the insulative plate and clamped between the insulative plate and the insulative cover.

7. The power module according to claim 1, wherein each high-voltage set comprises a housing and a plurality of high-voltage components accommodated in the housing.

8. The power module according to claim 7, wherein the housing comprises an air inlet and an air outlet, and a heat dissipation flow channel is defined between the air inlet and air outlet.

9. The power module according to claim 7, wherein an elastic supporter is arranged in the housing, and the elastic supporter passes through the housing to abut against the insulative cover.

10. The power module according to claim 1, wherein a plurality of fastening holes are disposed on the frame and penetrate the frame.

11. A rack device, comprising:
a cabinet; and
a plurality of power modules according to claim 1 stacked in the cabinet, the frame of each power module connected adjacently with the frame of another power module, and the frame of at least one of the power modules connected to the cabinet.

12. The rack device according to claim 11, wherein a fan is respectively arranged in the frame corresponding to each transformer.

13. The rack device according to claim 12, wherein each fan is disposed on an edge of the insulative plate and crosses two surfaces of the insulative plate.

14. The rack device according to claim 12, wherein each fan is electrically connected to each transformer correspondingly.

15. The rack device according to claim 11, wherein the insulative cover is arranged on a side of the frame.

16. The rack device according to claim 11, wherein the high-voltage sets are fixed on the insulative plate and clamped between the insulative plate and the insulative cover.

17. The rack device according to claim 11, wherein each high-voltage set comprises a housing and a plurality of high-voltage components accommodated in the housing.

18. The rack device according to claim 17, wherein the housing comprises an air inlet and an air outlet, and a heat dissipation flow channel is defined between the air inlet and air outlet.

19. The rack device according to claim 17, wherein an elastic supporter is arranged in the housing, and the elastic supporter passes through the housing to abut against the insulative cover.

20. The rack device according to claim 11, wherein a plurality of fastening holes is disposed on the frame and penetrate the frame.

* * * * *